US012683113B2

(12) United States Patent
Van Kan

(10) Patent No.: US 12,683,113 B2
(45) Date of Patent: Jul. 14, 2026

(54) ION MICROSCOPE

(71) Applicant: NATIONAL UNIVERSITY OF SINGAPORE, Singapore (SG)

(72) Inventor: Jeroen Anton Van Kan, Singapore (SG)

(73) Assignee: NATIONAL UNIVERSITY OF SINGAPORE, Singapore (SG)

( * ) Notice: Subject to any disclaimer, the term of this patent is extended or adjusted under 35 U.S.C. 154(b) by 431 days.

(21) Appl. No.: 18/267,837

(22) PCT Filed: Dec. 24, 2021

(86) PCT No.: PCT/SG2021/050824
§ 371 (c)(1),
(2) Date: Jun. 16, 2023

(87) PCT Pub. No.: WO2022/139689
PCT Pub. Date: Jun. 30, 2022

(65) Prior Publication Data
US 2024/0006146 A1     Jan. 4, 2024

(30) Foreign Application Priority Data

Dec. 24, 2020     (SG) ........................... 10202013025Q

(51) Int. Cl.
*H01J 37/12*          (2006.01)
*H01J 37/08*          (2006.01)
*H01J 37/26*          (2006.01)

(52) U.S. Cl.
CPC .............. *H01J 37/12* (2013.01); *H01J 37/08* (2013.01); *H01J 37/26* (2013.01);
(Continued)

(58) Field of Classification Search
CPC .. H01J 37/12; H01J 37/08; H01J 37/26; H01J 2237/0264; H01J 2237/082; H01J 2237/1207
See application file for complete search history.

(56) References Cited

U.S. PATENT DOCUMENTS

| | | |
|---|---|---|
| 4,694,170 A | 9/1987 | Slodzian |
| 2014/0001372 A1 | 1/2014 | Schwind |
| 2020/0185185 A1* | 6/2020 | Essers ..................... H01J 37/09 |

FOREIGN PATENT DOCUMENTS

| | | |
|---|---|---|
| WO | 2012/165955 A2 | 12/2012 |
| WO | 2020/148796 A1 | 7/2020 |

OTHER PUBLICATIONS

Xu Xinrin "Development and Optimization of High Brightness Nano-Aperture Ion Source for Proton Beam Writing Applications", Thesis, Aug. 25, 2017, XP055569358. <<website>> http://scholarbank.nus.edu.sg/bitstream/10635/137730/1/Xux.pdf. retrieved Mar. 14, 2019.

(Continued)

*Primary Examiner* — Georgia Y Epps
*Assistant Examiner* — Hanway Chang
(74) *Attorney, Agent, or Firm* — Volpe Koenig

(57)          ABSTRACT

An ion microscope, a method of constructing an ion microscope, and a method of aligning an ion beam in an ion microscope. The microscope comprises a nano-aperture ion source; and a focusing system; wherein the focusing system is configured for selectively coaxially focusing an ion beam generated from an electron beam ionizing an ionizing gas in the nano-aperture ion source and the electron beam.

20 Claims, 5 Drawing Sheets

(52) U.S. Cl.
 CPC . *H01J 2237/0264* (2013.01); *H01J 2237/082*
 (2013.01); *H01J 2237/1207* (2013.01)

(56) References Cited

OTHER PUBLICATIONS

Office Action issue in corresponding European Patent Application No. 21 911 691.0. on Oct. 16, 2024, consisting of 9 pp.

J.A. van Kan, A.A. Bettiol, F. Watt, Proton beam writing of three-dimensional nano-structures in hydrogen silsesquioxane, Nano Lett. 6 (3) (2006) 579-582.

F.Watt,M.B.Breese,A.A.Bettiol,J.A.vanKan,Protonbeamwriting,Mater. Today10 (6) (2007) 20-29.

J.A. Van Kan, A.A.Bettiol, F. Watt, Three-dimensional nanolithography using proton beam writing, Appl. Phys. Lett. 83 (8) (2003) 1629-1631.

C. Udalagama, A.A. Bettiol, F. Watt, Stochastic spatial energy deposition profiles for MeV protons and keV electrons, Phys. Rev. B 80 (22) (2009) 224107.

J.A. VanKan,P.Shao,K.Ansari,A.A.Bettiol,T.Osipowicz,F. Watt,Protonbeam writ-ing: a tool for high-aspect ratio mask production, Microsyst. Technol. 13 (5-6) (2007) 431-434.

R. Szymanski, D.N. Jamieson, Ion source brightness and nuclear microprobe applications, Nucl. Instrum. Methods Phys. Res., Sect. B 130 (1) (1997) 80-85.

J.A. Van Kan, P. Malar, A.B. De Vera, The second generation Singapore high resolution proton beam writing facility, Rev. Sci. Instrum. 83 (2) (2012) 02B902.

H.J. Leamy, J. Appl. Phys. 53 (1982) R51.

A. Castaldini, A. Cavallini, L. Polenta, C. Canali, C. delPapa, F. Nava, Phys. Rev. B 56 (1997) 9201.

M.B.H. Breese, E. Vittone, G. Vizkelethy, P.J. Sellin, Nuclear Instruments and Methods in Physics Research B 264 (2007) 345-360.

J.Orloff,L.Swanson,M.Utlaut, High Resolution Focused Ion Beams: FIB and Its Applications: the Physics of Liquid Metal Ion Sources and Ion Optics and their Application to Focused Ion Beam Technology, Springer Science & Business Media, 2003.

P.D. Prewett, G.L.R. Mair, Focused Ion Beams from Liquid Metal Ion Sources, Research Studies Press Ltd, 1991.

R. Forbest, Understanding how the liquid-metal ion source works, Vacuum 48 (1) (1997) 85-97.

G. Taylor, Disintegration of water drops in an electric field, Proc. R. Soc. Lond. A (1964) 383-397.

B.Ward, J.A. Notte, N. Economou, Helium ion microscope: a new tool for nanoscale microscopy and metrology, J. Vac. Sci. Technol. B 24 (6) (2006) 2871-2874.

G. Hlawacek, V. Veligura, R. van Gastel, and B. Poelsema, J. Vac. Sci. Technol. B 32, 020801 (2014).

F. Rahman, S. McVey, L. Farkas, J.A. Notte, S. Tan, R.H. Livengood, The prospects of a subnanometer focused neon ion beam, Scanning 34 (2) (2012) 129-134.

R. Hill, J. Notte, B. Ward, The ALIS He ion source and its application to high resolution microscopy, Phys. Procedia 1(1) (2008) 135-141.

H.-S. Kuo, S. Hwang, T.-Y. Fu, Y.-H. Lu, C.-Y. Lin, T.T. Tsong, Gas field ion source from an Ir/W b111N single-atom tip, Appl. Phys. Lett. 92 (2008) 063106.

N.G. Einspruch, S.S. Cohen, R.N. Singh, Beam Processing Technologies, Academic Press, 2014.

J.J. McClelland,A.V. Steele, B. Knuffman,K.A.Twedt,A. Schwarzkopf, T.M. Wilson, Bright focused ion beam sources based on laser-cooled atoms, Appl. Phys. Rev. 3 (1) (2016) 011302.

B. Knuffman, A. Steele, J. McClelland, Cold atomic beam ion source for focused ion beam applications, J. Appl. Phys. 114 (4) (2013) 044303.

S. Van der Geer, M. Reijnders, M. de Loos, E. Vredenbregt, P. Mutsaers, O. Luiten, Simulated performance of an ultracold ion source, J. Appl. Phys. 102 (9) (2007) 094312.

J.L. Hanssen, J.J. Mc Clelland, E. Dakin, M. Jacka, Laser-cooled atoms as a focused ion-beam source, Phys. Rev. A 74 (6) (2006) 063416.

J.L. Hanssen, S.B. Hill, J. Orloff, J.J. McClelland, Magneto-optical-trap-based, high brightness ion source for use as a nanoscale probe, Nano Lett. 8 (9) (2008) 2844-2850.

K.A. Twedt, L. Chen, J.J. Mc Clelland, Scanning ion microscopy with low energy lithium ions, Ultramicroscopy 142 (2014) 24-31.

D.S. Jun, V.G. Kutchoukov, P. Kruit, Ion beams in SEM: an experiment towards a high brightness low energy spread electron impact gas ion source, J. Vac. Sci. Technol. B 29 (6) (2011) 06F603.

Xu, X., Pang, R., Raman, P. S., Mariappan, R., Khursheed, A., and van Kan, J. A. 2017. "Fabrication and Development of High Brightness Nano-Aperture Ion Source," Microelectronic Engineering (174).

Van Kouwen, L., and Kruit, P. 2018. "Brightness Measurements of the Nano-Aperture Ion Source," Journal of Vacuum Science & Technology B (36:6), American Vacuum Society, p. 06J901.

Xu, X., Liu, N., Raman, P. S., Qureshi, S., Pang, R., Khursheed, A., and van Kan, J. A. 2017. "Design Considerations for a Compact Proton Beam Writing System Aiming for Fast Sub-10 Nm Direct Write Lithography," Nuclear Instruments and Methods in Physics Research, Section B: Beam Interactions with Materials and Atoms (404).

X. Xu, N. Liu, P.S. Raman, S. Qureshi, R. Pang, A. Khursheed, J.A. van Kan, Design considerations for a compact proton beam writing system aiming for fast sub-10 nm direct write lithography, Nucl. Instrum. Methods Phys. Res., Sect. B (2016) http://dx. doi.org/10. 1016/j.nimb.2016.12.031 (in press).

Wen Pin Lin and Hsiu Ju Chang, Physical Failure Analysis Cases by Electron Beam Absorbed Current & Electron Beam Induced Current Detection on Nano-Probing SEM System, IEEE 2010.

David N.JamiesonWilliam I.L.LawrieSimon G. RobsonAlexander M.JakobBrett C.JohnsonJeffrey C.McCallum, Mat. Scie. Semicon. Proc. 62 (2017) 23.

Joe O'Gorman, Naomi H Nickerson, Philipp Ross, John JL Morton and Simon C Benjamin, A silicon-based surface code quantum computer npj Quantum Information (2016) 2, 15019; doi:10.1038/ npjqi.2015.19.

J.A. van Donkelaar, C. Yang, A.D.C. Alves, J.C. McCallum, C.R. Hougaard, B.C. Johnson, F.E. Hudson, A.S. Dzurak, A. Morello, D. Spemann, D.N. Jamieson, Single atom devices by ion implantation, J. Phys. Cond. Mat. 27 (2015) 154204.

Jelezko, F., Gaebel, T., Popa, I., Gruber, A. & Wrachtrup, J. Observation of coherent oscillations in a single electron spin. Phys. Rev. Lett. 92, 076401 (2004).

Neumann, P. et al. Quantum register based on coupled electron spins in a room-temperature solid. Nat. Phys. 6, 249-253 (2010).

Childress, L. et al. Coherent dynamics of coupled electron and nuclear spin qubits in diamond. Science 314, 281-285 (2006).

S. Becker, N. Raatz, St. Jankuhn, R. John & J. Meijer, Nitrogen implantation with a scanning electron microscope, Scientific Reports (2018) 8:32 DOI:10.1038/s41598-017-18373-z.

I. (SIS) Scientific Instrument Ser vices, "Simion® Version 8.1." [Online]. Available. http://simion.com/.

\* cited by examiner

ION MICROSCOPE

TECHNICAL FIELD

This invention relates broadly to an ion microscope, a method of constructing an ion microscope, and to a method of aligning an ion beam in an ion microscope, in particular to the integration of a nano-aperture ion source, for deterministic ion implantation, ion beam induced current and/or a compact Proton Beam Writing (c-PBW) system, and to a method of accurate placement of implanted ions and PBW fabricated structures.

BACKGROUND

Any mention and/or discussion of prior art throughout the specification should not be considered, in any way, as an admission that this prior art is well known or forms part of common general knowledge in the field.

Proton beam writing (PBW) is a direct-write lithographic technique developed in the Centre for Ion Beam Applications, National University of Singapore (CIBA-NUS), which employs focused protons, for fabricating three-dimensional nano-structures. Compared with electron beam lithography (EBL), the advantage of PBW is that a proton is ~1800 times heavier than an electron, which makes a proton transferring less energy to secondary electrons and thus penetrating further into the material, depositing a constant energy along its path in the resist [4]. With these unique features, PBW can fabricate nano-structures without proximity effects, and having smooth sidewalls. Currently, the performance of PBW in terms of spot size and throughput is limited by low reduced brightness ~20 A/(m$^2$srV) of the radio frequency (RF) ion source, available in current PBW systems. Therefore, a high brightness ion source is desirable to further improve the performance of PBW systems.

Charge collection microscopy is based on the fact that charged particles or electromagnetic radiation create large quantities of e-h pairs in a semiconductor or insulator which are separated in the presence of an external or a built-in electric field. In charge collection microscopy the measured charge or current depends on materials characteristics like trapping and recombination centers at point defects as well as extended defects. Also doping density, minority carrier diffusion length, electric field strength, mobility etc. can be mapped. EBIC (electron beam induced current) which uses a highly focused keV electron beam is a popular mode of charge collection microscopy. Also light based methods like OBIC/LBIC (optical/laser beam induced current) are widely-used methods.

Ion beam induced charge (IBIC) microscopy typically uses a current of 0.1-10 fA (approximately 1-100,000 ions/s) of light fast ions and measures individual charge pulses, as opposed to continuous variations in an induced charge/current used in other forms of charge/current collection microscopy. As light ions produce a significant number of secondary electrons IBIC can operate at low beam currents. As the generated secondary electrons have an energy of ~10 s eV the range of these secondary electrons is rather minimal. A direct consequence of this characteristics is the fact that an ion beam tends to stay "focused" up to great depth. In comparison, lighter electrons used for EBIC undergo a strong lateral scattering as they travel into the material. These characteristics guarantee superior spatial resolution in IBIC compared to other forms of charge collection microscopy. Therefore, a high brightness ion source is desirable to further improve the performance of IBIC, especially using fast protons.

Ion sources like the liquid metal ion source (LMIS) and the gas field ionization source (GFIS) feature high reduced brightness. The LMIS features a liquid metal reservoir above a sharp tip. A strong electric field is used to pull the liquid metal to a sharp electrospray cone, known as Taylor cone. The most often used LMIS is Ga-LMIS but several other metals (e.g. Al, In, Sn, Cs, Bi, Au) as well as alloy metals (Au—Si, Au—Ge, Si—Be—Au, Ni—B—Pt) are also used. Also in other applications of ions, high brightness sources are required. For example, the gas field ionization source (GFIS) enabled interesting applications. The GFIS technology is not easily extended to heavier gases than neon though. A strong electric field is concentrated at the apex of a pyramidal tip, which terminates with three atoms. GFIS has been mostly used for generating He and Ne ions. For He-GFIS, the reduced brightness can reach as high as 10$^9$ A/(m$^2$srV) with a 1 eV energy spread. The small virtual source size (<1 nm), due to the three-atom terminated tip, results in having high brightness. Another approach to obtain a high brightness ion source is to reduce the beam angular spread, which can be achieved by reducing the source operating temperature (<100 µK). Such ion sources, operating at low temperatures (usually achieved by laser cooling), are called cold atom ion sources. These ion sources have a theoretical reduced brightness of around 10$^7$ A/(m$^2$srV), with <0.5 eV energy spread. Using laser-cooled Cr atoms and Li atoms, beams with reduced brightness of 2.25×10$^4$ A/(m$^2$srV) and 6×10$^3$ A/(m$^2$srV) have been achieved, respectively. Although these ion sources can deliver high brightness ion beams, they are not designed to produce high brightness proton beams.

Embodiments of the present invention seek to address one or more of the above-mentioned needs.

SUMMARY

In accordance with a first aspect of the present invention there is provided an ion microscope comprising a nano-aperture ion source; and focusing system; wherein the focusing system is configured for selectively coaxially focusing an ion beam generated from an electron beam ionizing an ionizing gas in the nano-aperture ion source and the electron beam.

In accordance with a second aspect of the present invention there is provided a method of constructing an ion microscope comprising the steps of providing a nano-aperture ion source; and providing a focusing system; wherein the focusing system is configured for selectively coaxially focusing an ion beam generated from an electron beam ionizing an ionizing gas in the nano-aperture ion source and the electron beam.

In accordance with a third aspect of the present invention there is provided a method of aligning an ion beam in an ion microscope comprising the steps of providing a nano-aperture ion source; and providing a focusing system; and selectively coaxially focusing the ion beam generated from an electron beam ionizing an ionizing gas in the nano-aperture ion source and the electron beam.

BRIEF DESCRIPTION OF THE DRAWINGS

The invention will be better understood with reference to the detailed description when considered in conjunction with the non-limiting examples and the accompanying drawings, in which:

FIG. 5(*b*) shows a schematic diagram illustrating point focusing using two or more electrostatic quadrupole lenses for use according to an example embodiment.

DETAILED DESCRIPTION

Figure 1:
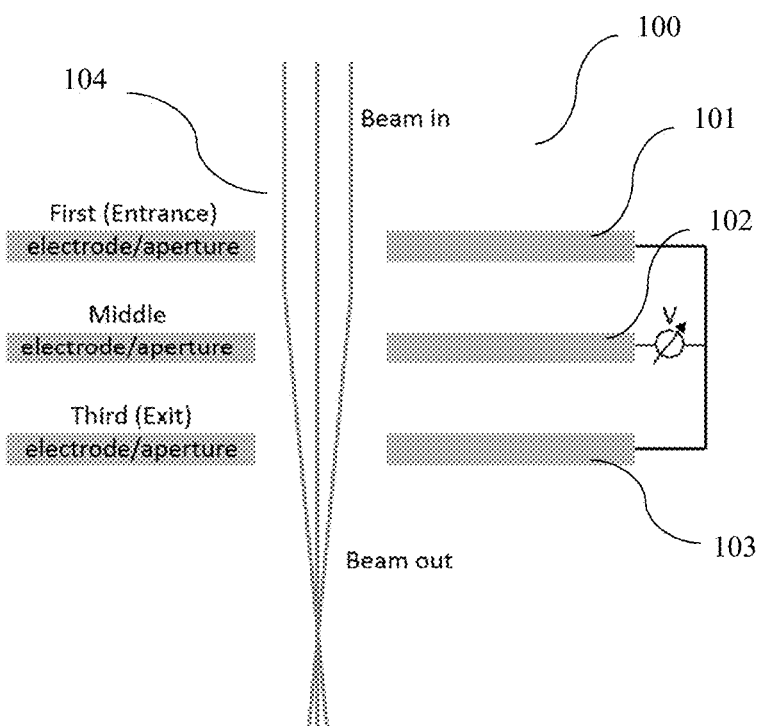
FIG. 1 shows a schematic of three-aperture Einzel lens for use according to an example embodiment. It comprises three apertures with first (entrance) and third (exit) apertures at same electric potential. The potential of middle aperture is used to adjust the focus of the beam.

A nano-aperture ion source (NAIS) with an estimated brightness of $10^6$ A/(m²srV) has been reported, in which the NAIS yields ions from an electron direct impact ionization mechanism, with demonstrated reduced brightness up to $1 \times 10^5$ A m⁻²sr⁻¹V⁻¹. Additionally, simulations have reached beam performance of ~$1 \times 10^6$ A m⁻²sr⁻¹V⁻¹ brightness and 0.5-1 nA current. Therefore, increased beam brightness with NAIS as the ion source is possible. This NAIS is expected to generate high brightness proton beams. It has been recognized by the present inventors that NAIS is a prospective candidate for a proton microscope featuring sub-10 nm beam spot sizes and high beam currents, according to an example embodiment. This can significantly improve resolution and throughput in PBW as well as improve 3D resolution in IBIC experiments. This system according to an example embodiment is expected to achieve writing speed comparable to those in EBL without the unwanted proximity effect and at the same time IBIC will be able to achieve resolutions down to sub 10 nm at depths down to microns, the specific performance depending on exact sample geometry and proton beam energy. Currently spatial resolutions in EBIC are limited to about 100 nm.

A single beam compact proton microscope system according to an example embodiment is more versatile in sub 10 nm lithography compared to electron beam lithography (EBL). As the NAIS has the flexibility to use any type of gas it can provide many types of ions. Using a wide variety of ions will make an example embodiment an attractive option for IBIC, vital in failure analysis of working integrated circuit devices down to sub 10 nm resolution, IBIC using fast protons will significantly improve the resolution, currently available in charge collection microscopies. Also, precise ion sputtering applications and fabrication of quantum computers through deterministic ion implantation will greatly benefit from the proton microscope according to an example embodiment. There is a growing demand for technology that can produce quantum computers on a large scale. Of crucial importance is the capability to configure single atoms in silicon, diamond and other materials with high lateral placement accuracy. The path to achieve practical implementation of ion implantation to realize a quantum computer are extremely challenging. Currently the positioning of ions is established via an aperture in a nanostencil, the practical implementation of this mode employs an Atomic Force Microscope (AFM) with a nanostencil milled in to the Si arm of the AFM cantilever. In this approach the AFM cantilever can be used to image the surface to facilitate mapping of the surface. However, existing advanced ion sources are not readily compatible with the required precision needed in deterministic ion implantation. Also, the production of Nitrogen Vacancies (NV) centers at exact locations faces huge challenges. The production of these NV centers via N ion implantation can form the basic building block of qubits. In an existing practical demonstration of NV center production the exact localization of N ions is achieved via PMMA masks.

In an example embodiment, the present invention provides design of a system that can function as a NAIS based ion microscope, featuring electrostatic ion extraction as well as electrostatic ion beam focusing. The electrostatic ion beam focusing uses, for example, a combination of two or more cylinder lenses, in one embodiment an Einzel lens, which is a combination of three cylinder lenses, or using a combination of two or more quadrupole lenses. During operation of a NAIS based ion microscope according to an example embodiment, the NAIS is filled with a gas of interest. On the other hand, the system according to an example embodiment can also function as an electron microscope, for example by removing the gas from the NAIS and at the same time changing the polarity of the Einzel lenses. With those changes, the electron beam, in one embodiment with the same energy as a single charged ion beam, will follow exactly the same path through the microscope.

When using a set of electrostatic quadrupole lenses no changes to the potentials of the lenses are needed to achieve electron beam focusing. Instead, when changing from ion to electron beam focusing, the only thing that happens is that the beam focusing action is rotated over 90° as is described below with reference to FIG. 4, but the focused spot will be in the same position as for the ion beam.

Accordingly, example embodiments of the present invention advantageously enable accurate mapping of a sample surface and therefore can preferably guarantee accurate deterministic ion implantation with respect to a sample surface, and at the same time alignment for IBIC experiments can be achieved as well.

It is noted that considering an ion and an electron, both of equal energy and singly charged, under the influence of a magnetic field, the difference in radius of curvature is equivalent to the square root of the mass of the ion over the mass of the electron, i.e. about 43. Accordingly, shielding of unwanted external/stray magnetic fields is preferably provided in example embodiments for optimum alignment between the focused electron beam and the focused ion beam.

Operating the NAIS of the NAIS microscope according to an example embodiment with hydrogen in the ionization chamber advantageously allows the use of a focused proton beam for typical focused proton beam applications (IBIC, PBW, deterministic implantation), in addition to its use for high resolution microscopy. As a proton beam induces minimal damage to a system, it can be used in IBIC to image not only deep inside an integrated circuit but also image the surface topography of an integrated circuit under study. These two modalities (ion beam/electron beam) facilitate accurate alignment in charge collection microscopy. Signals used in the microscopy according to an example embodiment can be electron or ion induced charges, electron or ion induced secondary electrons, backscattered electrons or ions, electron or ion induced luminescence etc.

In an example embodiment, a low 0.1-30 kV energy ion microscope system incorporating a nano-aperture ion source, e.g. in the form of an ionization chamber chip, is provided for implementing a deterministic ion implantation, ion beam induced current and compact Proton Beam Writing (c-PBW) system, preferably enabling accurate placement of implanted ions and PBW fabricated structures.

The energy window of operation of such a coaxial charged particle (ion/electron) microscope according to an example embodiment can range from about 0.1 to 10 s keV. An even wider energy window up to about 200 keV or more can be used in example embodiments, but radiation shielding should be implemented to reduce radiation caused by high energetic electrons in such example embodiments, as will be appreciated by a person skilled in the art.

In an example embodiment, the use of NAIS, as a high brightness and low energy spread ion source, offers compelling advantages over other ion sources. In principle, any gas that can be ionized is compatible with NAIS, enabling the generation of ion beams spanning different gaseous ion species with simple and convenient way to switch among different gas species. In a non-limiting example embodiment, the design consideration of a proton microscope equipped with hydrogen NAIS is described herein.

When secondary electrons are generated along the incident ions' path, some secondary electrons near the surface can escape. Compared to electron-induced secondary electrons, ion-induced secondary electrons have lower energy and higher yield due to the larger mass difference between ions and electrons. Additionally, ions have a smaller interaction volume than electrons with same energy. The interaction volume can be referred to as effective probe size. These secondary electrons generated by low energy ions are advantageous and sensitive in the topmost surface of a target with high signal to noise ratio and small interaction volume. Therefore, low energy ion microscopy (including proton) is suitable to image topographic contrast with high surface sensitivity.

However, for ion microscopy, the ion probe size generally shrinks with the increase of ion energy. At low energy, ion probe size is typically limited by chromatic aberration with the absence of diffraction aberration due to the low wavelength of ion when comparing to electrons. Therefore, a high brightens and low energy spread ion source with reduced chromatic aberration is desirable. In an example embodiment, the use of NAIS as part of a low energy proton microscope for any gaseous ion species, equipped with a low chromatic aberration focus lens, can preferably address that need.

In an example embodiment, an Einzel lens is used as an electrostatic lens to exploit that an electrostatic lens can focus a charged particle beam, (either electron or ion) without changing its beam energy. With reference to FIG. 1, generally, an Einzel lens 100 comprises three symmetrical apertures or tubes 101-103 with the same electric potential at the first (entrance) apertures 101 and third (exit) aperture 103. The electric potential at the middle aperture 102 is varied to focus the beam 104 either by acceleration-deceleration or deceleration-acceleration mode. In acceleration-deceleration (A-D) mode, the charged particle beam is accelerated between apertures 101 and 102, and decelerated between apertures 102 and 103, i.e. with no net change in the beam energy. Similarly, in deceleration-acceleration (D-A)

mode, the charged particle beam is decelerated between apertures 101 and 102, and accelerated between apertures 102 and 103, i.e. with no net change in the beam energy. For an Einzel lens 100 comprising three apertures 101-103, typically the size of apertures 101-103 and distance between apertures 101-103 are about the same as the working distance of the Einzel lens 100. The advantage of the Einzel lens 100 is its simplicity, compactness and no dissipation of external power. Generally, the chromatic aberration of the Einzel lens 100 relies on its design, geometry and operating condition. The coefficient of chromatic aberration is approximately equal to the focal length.

The final focused probe size, for a low energy proton microscope, is mainly limited by the demagnified virtual source size at imaging plane, chromatic aberration and spherical aberration. SIMION® 8.1 is capable of simulating the performance of a low energy proton microscope equipped with NAIS and miniaturized Einzel lens, according to an example embodiment.

Figure 2:
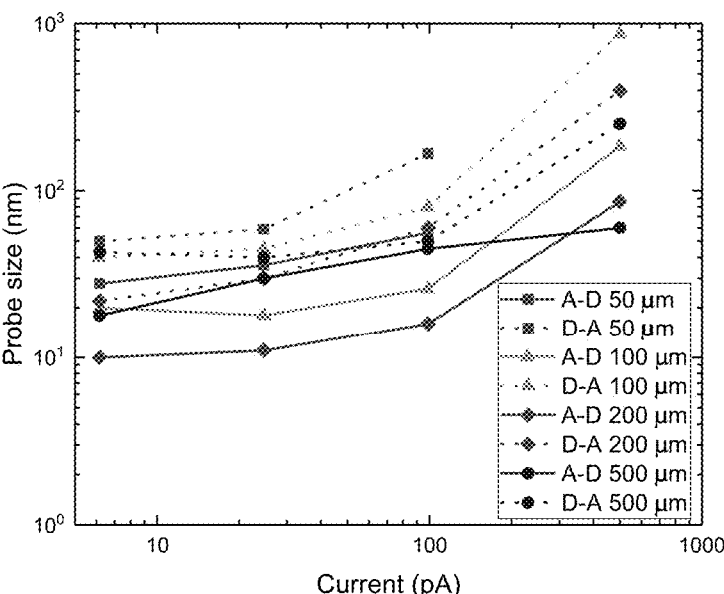
FIG. 2 shows a graph illustrating proton probe size as function of probe current for different three-aperture sizes for acceleration-deceleration (A-D) and deceleration-acceleration (D-A) modes with 1 keV protons, according to an example embodiment.

A NAIS with $10^6$ A/(m²srV) reduced brightness, 500 pA current, 1 eV energy spread, and 60 nm virtual source size is adopted for this evaluation, according to an example embodiment. Protons are generated by electron-gas collisions, in NAIS, and extracted with a tunable extraction voltage. The Einzel lens is positioned downstream. FIG. 2 shows a graph illustrating proton probe size as function of probe current for different three-aperture sizes for A-D and D-A) modes with 1 keV protons. With the size of each of the three apertures of 200 µm, 10 nm probe size can be obtained according to an example embodiment. It is noted that in different example embodiments, more powerful lenses should be able to focus to single digit nm probe size.

Figure 3:
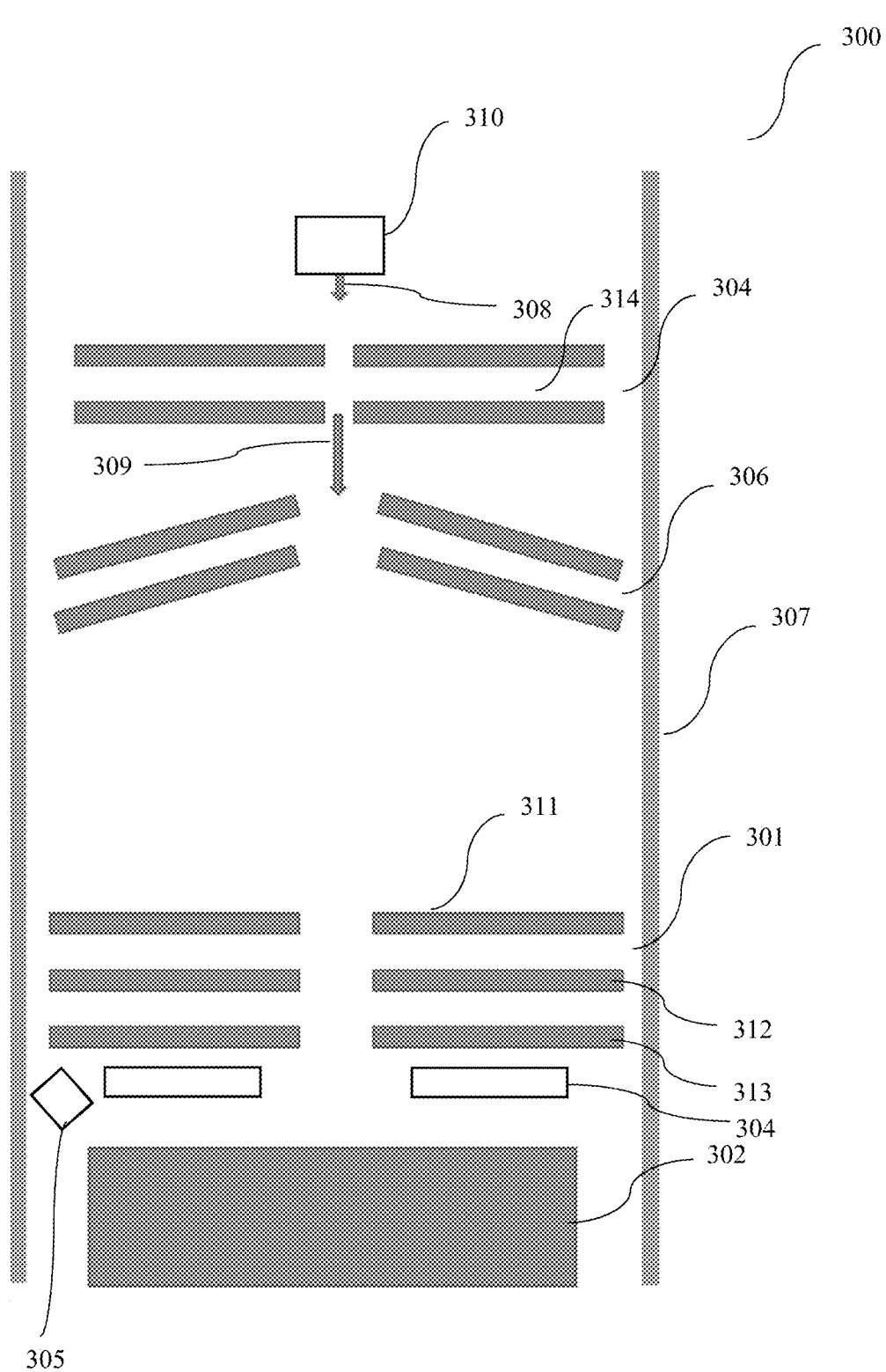
FIG. 3 shows a schematic drawings illustrating a NAIS based microscope according to an example embodiment.

As the focusing capability of electrostatic lenses (e.g. Einzel lens, electrostatic quadrupole lens, etc.) are only dependent on the charge of the particle (e.g. ion or electron), a particular design will work equally well for other types of ions, according to an example embodiment. An Einzel lens can also focus down electrons of the same energy as a single charged ion by just changing the polarity to the Einzel lenses. A schematic drawing of a non-limiting example implementation of a NAIS based microscope 300 equipped with Einzel lens 301, according to an example embodiment, is shown in FIG. 3. In one microscope operation mode, signals in the microscope 300 are obtained via electron or ion induced charges, electron or ion induced secondary electrons, backscattered electrons or ions, electron or ion induced luminescence etc. from sample surfaces that are imaged on the sample stage 302. Annular detector(s) e.g. 304 and/or detector(s) e.g. 305 disposed from the side relative to the sample stage 302 can be used in example embodiments for ion, electron and/or luminescence detection. A shielding structure 307 for shielding external/stray magnetic fields is provided, preferably all around the microscope 300. Also, the materials used to build up the microscope 300 with its various components are preferably chosen to avoid remnant magnetic fields.

Advantageously, through simply removing the gas in the NAIS source 304 and changing the polarity of the electrostatic lenses 311-313 of the Einzel lens 301, the ion microscope 300 will now function as an electron microscope where the ions and electrons will follow exactly the same beam path. If the electron beam 308 has the same absolute energy as the proton beam 309, then the extractor-accelerator section 306 is not needed to be applied for the electrons. It is noted that in different example embodiments, the energy of the electron beam 308 does not have to be the same as that of the proton beam 309, while still maintaining the advantages of the co-axial electron beam imaging. The energy of the electron beam may be adjusted using the extractor-accelerator section 306 and/or directly at the electron injector 310. Signals in the electron microscope operation can be obtained via electron beam induced secondary electron emission and/or electron (back)scattering and/or electron induced luminescence from sample surfaces that are imaged on the sample stage 302. It is noted that the number of electrons/ions can be measured, e.g. by measuring the current.

It is noted that in another example embodiment, the nano-aperture ion source 304 is configured for selectively moving into a first position relative to the Einzel lens when the ion beam 309 is being focused, and into a second position relative to the Einzel lens when the electron beam 308 is being focused, wherein in the first position the electron beam 308 enters the ionization chamber 314 of the nano-aperture ion source 304 for ionizing the ionizing gas, and wherein in the second position, the electron beam 308 by-passes the ionization chamber 314 of the nano-aperture ion source 304, for example by passing through a through hole formed in the nano-aperture ion source 304 outside the ionization chamber 314.

As mentioned above, in another example embodiment, instead of an electrostatic focusing system, e.g. the Einzel lens 301, a focusing system based on two or more electrostatic quadrupole lenses may be used.

Figures 4A, 4B:
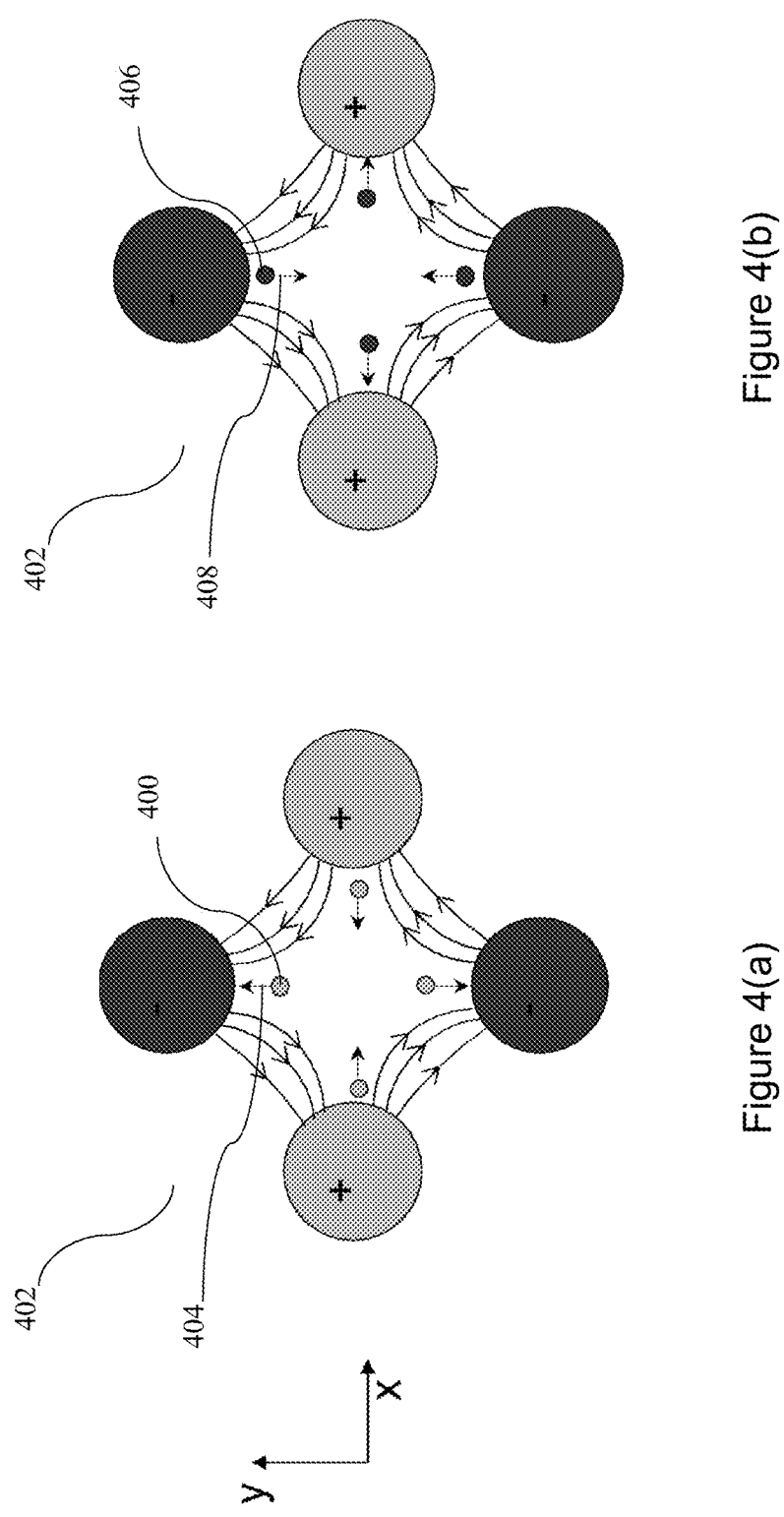
FIGS. 4(*a*) and (*b*) show schematic drawings of one electrostatic quadrupole lens.
Figures 5A, 5B:
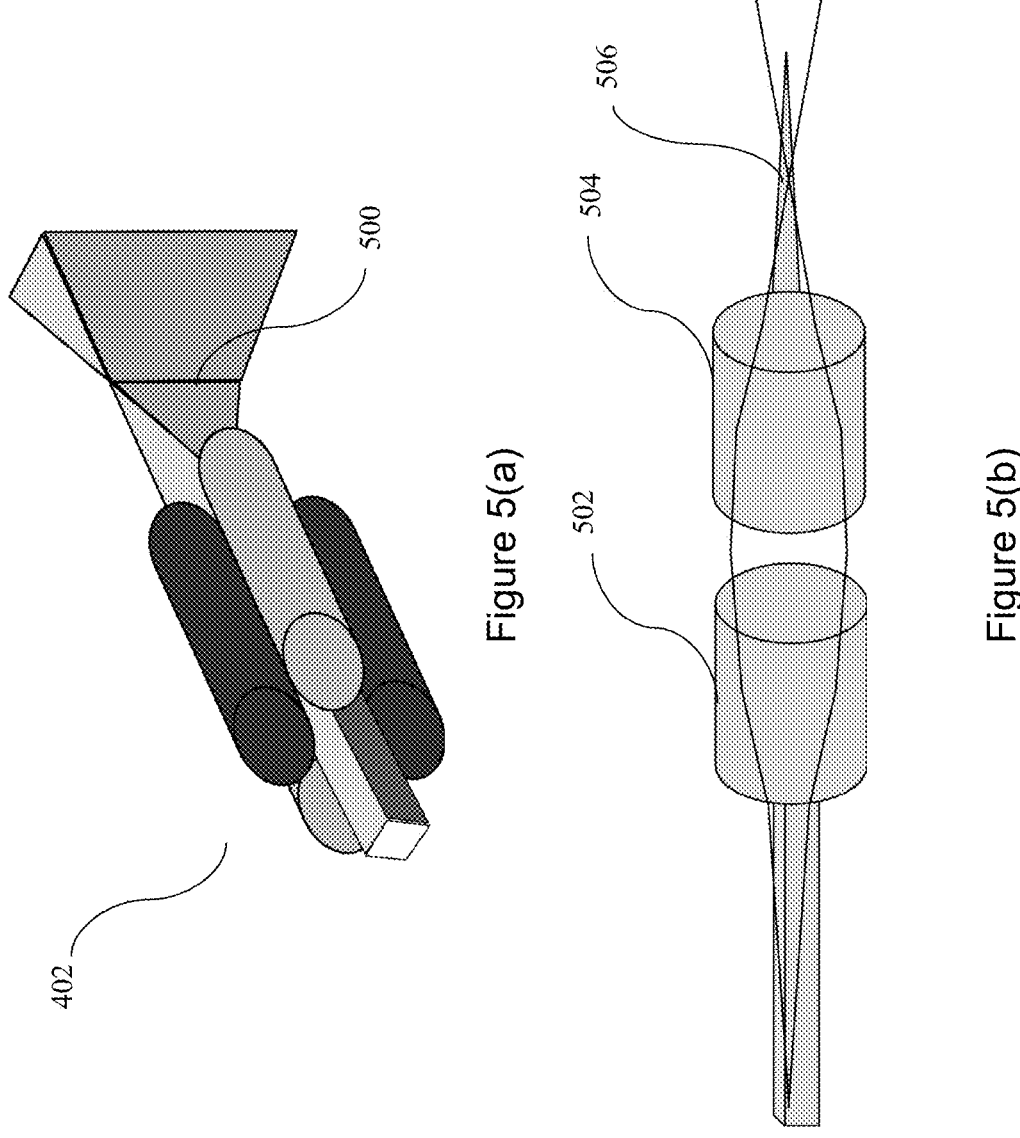
FIG. 5(*a*) shows a schematic diagram illustrating line focusing using a single electrostatic quadrupole lens.

As shown in FIG. 4(*a*), a positively charged particle e.g. 400 entering down into the lens quadrupole lens 402 will be focused in the x direction and therefore forms a vertical line focus, as illustrated in FIG. 5(*a*). The electrostatic force acting on a positively charged particle e.g. 400 is indicated with an arrow e.g. 404. If a negatively charged particle e.g. 406 traverse the same lens 402, it will be focused in the y direction creating a horizontal line focus 500 as illustrated in FIG. 5(*a*), but rotated over 90°. The electrostatic force acting on a negatively charged particle e.g. 406 is indicated with an arrow e.g. 408. To focus a charged particle beam using electrostatic quadrupole lenses it is apparent that at least 2 lenses 502, 504 which are rotated over 90° with respect to each other are needed to form a spot 506, as illustrated in FIG. 5(*b*). This type of electrostatic quadrupole lenses can be configured in such a way that the demagnification of such a lens system will allow beam focusing to single digit nano mete, according to an example embodiment.

The proposed geometry according to example embodiments will greatly facilitate alignment of intended ion beam experiments. In the case of PBW the substrate and/or pre-fabricated alignment markers can be mapped with an electron beam or proton beam facilitating exact positioning of intended lithographic structures.

Also, in the case of precise ion implantation the coaxial electron beam imaging of the sample will guarantee accurate deterministic ion implantation at desired locations.

Also, in the case of IBIC either proton beams or electron beams can be used to precisely align the proton beam with respect to the integrated circuit that is to be tested.

In one embodiment, an ion microscope is provided comprising a nano-aperture ion source; and a focusing system; wherein the focusing system is configured for selectively coaxially focusing an ion beam generated from an electron beam ionizing an ionizing gas in the nano-aperture ion source and the electron beam.

The focusing system may comprises one or more electrostatic lenses. The focusing system may comprise two or more cylinder lenses, or two or more quadrupole lenses. The focusing system may comprise an Einzel lens.

The microscope may comprise an electron injector for generating the electron beam.

The microscope may comprise an electrostatic extractor/acceleration section for extracting/accelerating the ion beam from the nano-aperture ion source.

The nano-aperture ion source may be configured for selectively containing the ionizing gas when the ion beam is being focused by the focusing system, and to be free of the ionizing gas when the electron beam is being focused by the focusing system.

The nano-aperture ion source may be configured for selectively moving into a first position relative to the focusing system when the ion beam is being focused by the focusing system, and into a second position relative to the focusing system when the electron beam is being focused by the focusing system, wherein in the first position the electron beam enters an ionization chamber of the nano-aperture ion source for ionizing the ionizing gas, and wherein in the second position, the electron beam by-passes the ionization chamber of the nano-aperture ion source.

The microscope may comprise a detection system. The detection system may be configured to detect one or more of a group consisting of electron or ion induced charges, electron or ion induced secondary electrons, backscattered electrons or ions, and electron or ion induced luminescence.

The microscope may comprise a shielding structure for shielding external/stray magnetic fields.

Figure 6:
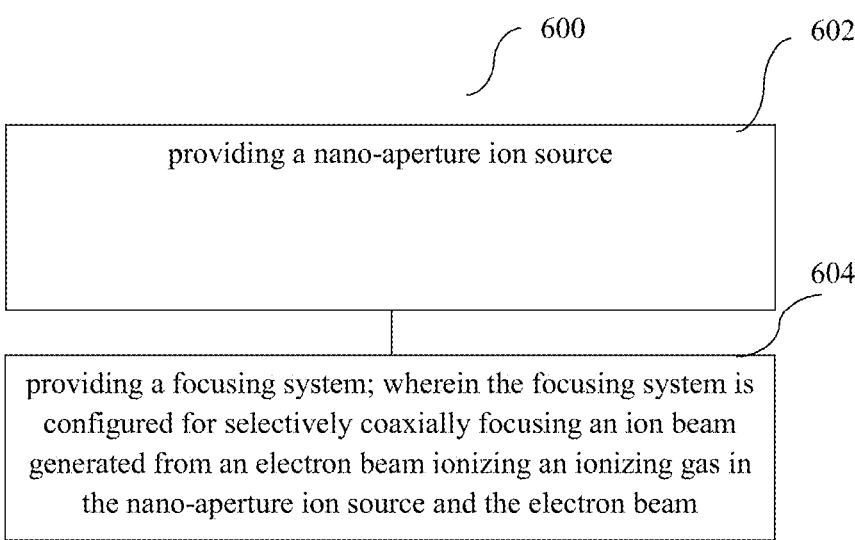
FIG. 6 shows a flowchart illustrating a method of constructing an ion microscope, according to an example embodiment.

FIG. 6 shows a flowchart 600 illustrating a method of constructing an ion microscope, according to an example embodiment. At step 602, a nano-aperture ion source is provided. At step 604, a focusing system is provided, wherein the focusing system is configured for selectively coaxially focusing an ion beam generated from an electron beam ionizing an ionizing gas in the nano-aperture ion source and the electron beam.

The focusing system may comprises one or more electrostatic lenses. The focusing system may comprise two or more cylinder lenses, or two or more quadrupole lenses. The focusing system may comprise an Einzel lens.

The method may comprise providing an electron injector for generating the electron beam.

The method may comprise providing an electrostatic extractor/acceleration section for extracting/accelerating the ion beam from the nano-aperture ion source.

The nano-aperture ion source may be configured for selectively containing the ionizing gas when the ion beam is being focused by the focusing system, and to be free of the ionizing gas when the electron beam is being focused by the focusing system.

The nano-aperture ion source may be configured for selectively moving into a first position relative to the focusing system when the ion beam is being focused by the focusing system, and into a second position relative to the focusing system when the electron beam is being focused by the focusing system, wherein in the first position the electron beam enters an ionization chamber of the nano-aperture ion source for ionizing the ionizing gas, and wherein in the second position, the electron beam by-passes the ionization chamber of the nano-aperture ion source.

The method may comprise shielding external/stray magnetic fields.

The method may comprise providing a detection system configured to detect one or more of a group consisting of electron or ion induced charges, electron or ion induced secondary electrons, electron or ion induced backscattered electrons or ions respectively, and ion or electron induced luminescence.

Figure 7:
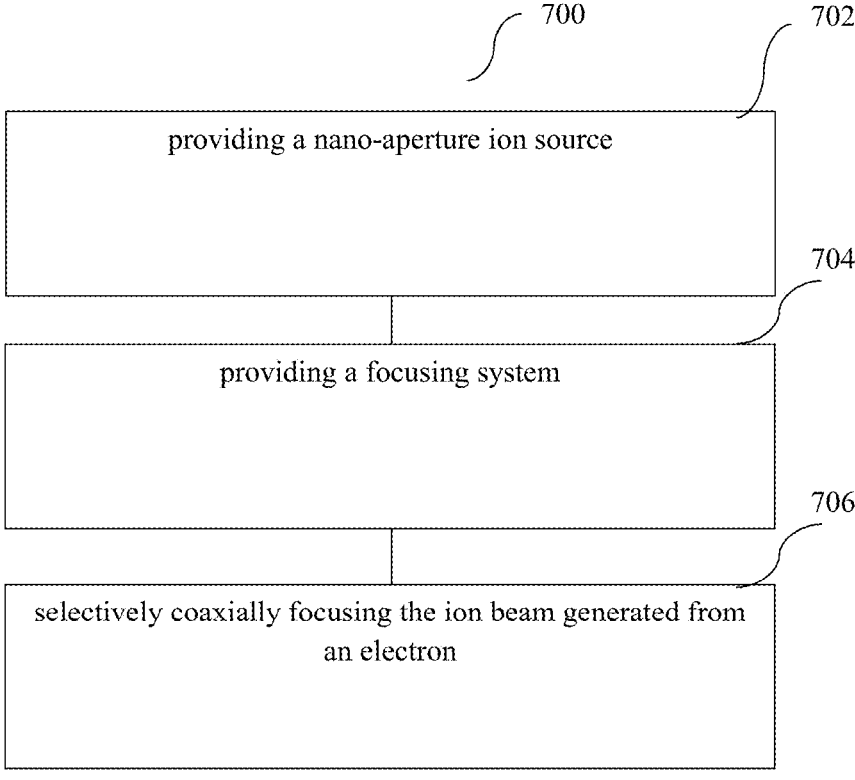
FIG. 7 shows a flowchart illustrating method of aligning an ion beam in an ion microscope, according to an example embodiment.

FIG. 7 shows a flowchart 700 illustrating method of aligning an ion beam in an ion microscope, according to an example embodiment. At step 702, a nano-aperture ion source is provided. At step 704, a focusing system is provided. At step 706, the ion beam generated from an electron beam ionizing an ionizing gas in the nano-aperture ion source and the electron beam are selectively coaxially focused.

The focusing system may comprises one or more electrostatic lenses. The focusing system may comprise two or more cylinder lenses, or two or more quadrupole lenses. The focusing system may comprise an Einzel lens.

The method may comprise providing an electron injector for generating the electron beam.

The method may comprise using an electrostatic extractor/acceleration section for extracting/accelerating the ion beam from the nano-aperture ion source.

The method may comprise selectively providing the ionizing gas in the nano-aperture ion source when the ion beam is being focused by the focusing system, and to be free of the ionizing gas when the electron beam is being focused by the focusing system.

The method may comprise selectively moving the nano-aperture ion source into a first position relative to the focusing system when the ion beam is being focused by the focusing system, and into a second position relative to the focusing system when the electron beam is being focused by the focusing system, wherein in the first position the electron beam enters an ionization chamber of the nano-aperture ion source for ionizing the ionizing gas, and wherein in the second position, the electron beam by-passes the ionization chamber of the nano-aperture ion source.

The method may comprise using a detection system to detect one or more of a group consisting of electron or ion induced charges, electron or ion induced secondary electrons, electron or ion induced backscattered electrons or ions respectively, and ion or electron induced luminescence.

The method may comprise shielding external/stray magnetic fields.

Aspects of the systems and methods described herein such as the control of various components of the microscope, e.g. the NAIS, the electron injector, the Extractor-Acceleration section, the detector(s) and the electrostatic lens, may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the system include: microcontrollers with memory (such as electronically erasable programmable read only memory (EEPROM)), embedded microprocessors, firmware, software, etc. Furthermore, aspects of the system may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

The above description of illustrated embodiments of the systems and methods is not intended to be exhaustive or to limit the systems and methods to the precise forms disclosed. While specific embodiments of, and examples for, the systems components and methods are described herein for illustrative purposes, various equivalent modifications are possible within the scope of the systems, components and methods, as those skilled in the relevant art will recognize. The teachings of the systems and methods provided herein can be applied to other processing systems and methods, not only for the systems and methods described above.

The elements and acts of the various embodiments described above can be combined to provide further embodiments. These and other changes can be made to the systems and methods in light of the above detailed description.

In general, in the following claims, the terms used should not be construed to limit the systems and methods to the specific embodiments disclosed in the specification and the claims, but should be construed to include all processing systems that operate under the claims. Accordingly, the systems and methods are not limited by the disclosure, but instead the scope of the systems and methods is to be determined entirely by the claims.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The invention claimed is:

1. An ion microscope comprising:
a nano-aperture ion source; and
a focusing system;
wherein the focusing system is configured for selectively coaxially focusing an ion beam generated from an electron beam ionizing an ionizing gas in the nano-aperture ion source and the electron beam such that the electron beam and the ion beam follow the same path through the ion microscope.

2. The microscope of claim 1, wherein the focusing system comprises one or more electrostatic lenses.

3. The microscope of claim 2, wherein the focusing system comprises two or more cylinder lenses, or two or more quadrupole lenses, and optionally, wherein the focusing system comprises an Einzel lens.

4. The microscope of claim 1, comprising an electron injector for generating the electron beam, or comprising an electrostatic extractor/acceleration section for extracting/accelerating the ion beam from the nano-aperture ion source.

5. The microscope of claim 1, wherein the nano-aperture ion source is configured for selectively containing the ionizing gas when the ion beam is being focused by the focusing system, and to be free of the ionizing gas when the electron beam is being focused by the focusing system, or wherein the nano-aperture ion source is configured for selectively moving into a first position relative to the focusing system when the ion beam is being focused by the focusing system, and into a second position relative to the focusing system when the electron beam is being focused by the focusing system, wherein in the first position the electron beam enters an ionization chamber of the nano-aperture ion source for ionizing the ionizing gas, and wherein in the second position, the electron beam by-passes the ionization chamber of the nano-aperture ion source.

6. The microscope of claim 1, comprising a detection system configured to detect one or more of a group consisting of electron or ion induced charges, electron or ion induced secondary electrons, backscattered ions, and ion or electron induced luminescence.

7. The microscope of claim 1, comprising a shielding structure for shielding external/stray magnetic fields.

8. A method of constructing an ion microscope comprising the steps of:

providing a nano-aperture ion source; and
    providing a focusing system;
    wherein the focusing system is configured for selectively coaxially focusing an ion beam generated from an electron beam ionizing an ionizing gas in the nano-aperture ion source and the electron beam such that the electron beam and the ion beam follow the same path through the ion microscope.

9. The method of claim 8, wherein the focusing system comprises one or more electrostatic lenses.

10. The method of claim 9, wherein the focusing system comprises two or more cylinder lenses, or two or more quadrupole lenses, and optionally wherein the focusing system comprises an Einzel lens.

11. The method of claim 8, comprising providing an electron injector for generating the electron beam, or comprising providing an electrostatic extractor/acceleration section for extracting/accelerating the ion beam from the nano-aperture ion source.

12. The method of claim 8, wherein the nano-aperture ion source is configured for selectively containing the ionizing gas when the ion beam is being focused by the focusing system, and to be free of the ionizing gas when the electron beam is being focused by the focusing system, or wherein the nano-aperture ion source is configured for selectively moving into a first position relative to the focusing system when the ion beam is being focused by the focusing system, and into a second position relative to the focusing system when the electron beam is being focused by the focusing system, wherein in the first position the electron beam enters an ionization chamber of the nano-aperture ion source for ionizing the ionizing gas, and wherein in the second position, the electron beam by-passes the ionization chamber of the nano-aperture ion source.

13. The method of claim 8, comprising providing a detection system, and optionally wherein the detection system is configured to detect one or more of a group consisting of electron or ion induced charges, electron or ion induced secondary electrons, backscattered ions, and ion or electron induced luminescence.

14. The method of claim 8, comprising shielding external/stray magnetic fields.

15. A method of aligning an ion beam in an ion microscope comprising the steps of:

providing a nano-aperture ion source; and
    providing a focusing system; and
    selectively coaxially focusing the ion beam generated from an electron beam ionizing an ionizing gas in the nano-aperture ion source and the electron beam such that the electron beam and the ion beam follow the same path through the ion microscope.

16. The method of claim 15, wherein the focusing system comprises one or more electrostatic lenses.

17. The method of claim 16, wherein the focusing system comprises two or more cylinder lenses, or two or more quadrupole lenses, and optionally wherein the focusing system comprises an Einzel lens.

18. The method of claim 15, comprising providing an electron injector for generating the electron beam, or comprising using an electrostatic extractor/acceleration section for extracting/accelerating the ion beam from the nano-aperture ion source.

19. The method of claim 15, comprising selectively providing the ionizing gas in the nano-aperture ion source when the ion beam is being focused by the focusing system, and to be free of the ionizing gas when the electron beam is being focused by the focusing system, or comprising selectively moving the nano-aperture ion source into a first position relative to the focusing system when the ion beam is being focused by the focusing system, and into a second position relative to the focusing system when the electron beam is being focused by the focusing system, wherein in the first position the electron beam enters an ionization chamber of the nano-aperture ion source for ionizing the ionizing gas, and wherein in the second position, the electron beam by-passes the ionization chamber of the nano-aperture ion source.

20. The method of claim 15, comprising using a detection system to detect one or more of a group consisting of electron or ion beam induced charges, electron or ion induced secondary electrons, backscattered ions, and ion or electron induced luminescence, or comprising shielding external/stray magnetic fields.

\* \* \* \* \*